(12) United States Patent
Chen (10) Patent No.: US 12,276,695 B2
(45) Date of Patent: Apr. 15, 2025

(54) CHIP TESTING METHOD AND APPARATUS

(71) Applicant: CHANGXIN MEMORY TECHNOLOGIES, INC., Hefei (CN)

(72) Inventor: Liang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 462 days.

(21) Appl. No.: 17/660,798

(22) Filed: Apr. 26, 2022

(65) Prior Publication Data

US 2023/0176113 A1 Jun. 8, 2023

(30) Foreign Application Priority Data

Dec. 6, 2021 (CN) .......................... 202111511707.5

(51) Int. Cl.
*G01R 31/28* (2006.01)
(52) U.S. Cl.
CPC ................................ *G01R 31/2882* (2013.01)
(58) Field of Classification Search
CPC ............ G01R 31/2882; G01R 31/2851; G01R 31/31725; G01R 31/31726
See application file for complete search history.

(56) References Cited

U.S. PATENT DOCUMENTS

| | | | | |
|---|---|---|---|---|
| 2007/0266290 | A1* | 11/2007 | Yamada | G01R 31/31727 714/742 |
| 2010/0002819 | A1* | 1/2010 | Conner | G06F 11/263 375/355 |
| 2010/0090709 | A1* | 4/2010 | Watanabe | G01R 31/31709 324/555 |

FOREIGN PATENT DOCUMENTS

CN 104866638 B 11/2019

* cited by examiner

*Primary Examiner* — Manuel L Barbee
(74) *Attorney, Agent, or Firm* — Syncoda LLC; Feng Ma (57) ABSTRACT

A chip testing method includes: a data receiving window corresponding to each chip to be tested is determined; a time adjustment parameter corresponding to each chip to be tested is determined according to the data receiving window corresponding to each chip to be tested and a data input window preset for a test machine is determined; an actual input time point corresponding to each chip to be tested is determined according to the time adjustment parameter corresponding to each chip to be tested; and data is inputted to each chip to be tested at the actual input time point corresponding to the each chip to be tested, to enable each chip to be tested to receive the data inputted by the test machine in the data receiving window corresponding to the each chip to be tested.

18 Claims, 9 Drawing Sheets

CHIP TESTING METHOD AND APPARATUS

CROSS-REFERENCE TO RELATED APPLICATION

The application claims priority to Chinese Patent Application No. 202111511707.5 filed on Dec. 6, 2021, the disclosure of which is hereby incorporated herein by reference in its entirety.

BACKGROUND

In the process flow of electronic components, there are various testing stages according to process requirements. The purpose of the testing stages is to screen out defective products to prevent them from entering a next process, thereby reducing redundant manufacturing costs in the next process.

A common set of timing information is typically shared by chips in a test process, that is to say, input times of data for all chips to be tested remain consistent, and input data provided by a test machine arrives at all the chips to be tested simultaneously.

SUMMARY

Embodiments of the present disclosure relate to the technical field of chip testing, and in particular to a chip testing method and apparatus.

Embodiments of the present disclosure provide a chip testing method and apparatus, which can solve the technical problem that, when multiple chips to be tested use the same timing information to receive data, a part of the chips to be tested may not accurately receive the data due to performance differences.

According to a first aspect, there is provided a chip testing method, including: a data receiving window corresponding to each chip to be tested is determined; a time adjustment parameter corresponding to each chip to be tested is determined according to the data receiving window corresponding to each chip to be tested and a data input window preset for a test machine is determined; an actual input time point corresponding to each chip to be tested is determined according to the time adjustment parameter corresponding to each chip to be tested; and data is inputted to each chip to be tested at the actual input time point corresponding to the each chip to be tested, to enable each chip to be tested to receive the data inputted by the test machine in the data receiving window corresponding to the each chip to be tested.

According to a second aspect, there is provided a chip testing apparatus, including a memory storing processor-executable instructions, and a processor. The processor is configured to execute the stored processor-executable instructions to perform operations of: determining a data receiving window corresponding to each chip to be tested; determining a time adjustment parameter corresponding to each chip to be tested according to the data receiving window corresponding to each chip to be tested and a data input window preset for a test machine; determining an actual input time point corresponding to each chip to be tested according to the time adjustment parameter corresponding to each chip to be tested; and inputting data to each chip to be tested at the actual input time point corresponding to the each chip to be tested, to enable each chip to be tested to receive the data inputted by the test machine in the data receiving window corresponding to the each chip to be tested.

According to a third aspect, there is provided a non-transitory computer-readable storage medium having stored thereon computer-executable instructions that, when executed by a processor, cause the processor to perform operations of: determining a data receiving window corresponding to each chip to be tested; determining a time adjustment parameter corresponding to each chip to be tested according to the data receiving window corresponding to each chip to be tested and a data input window preset for a test machine; determining an actual input time point corresponding to each chip to be tested according to the time adjustment parameter corresponding to each chip to be tested; and inputting data to each chip to be tested at the actual input time point corresponding to the each chip to be tested, to enable each chip to be tested to receive the data inputted by the test machine in the data receiving window corresponding to the each chip to be tested.

BRIEF DESCRIPTION OF THE DRAWINGS

In order to more clearly describe the embodiments of the present disclosure or the technical solutions in the prior art, the accompanying drawings required for use in the description of the embodiments of the present disclosure or the prior art will be briefly described below. It will be apparent that the accompanying drawings in the following description are some embodiments of the present disclosure, and other drawings may be obtained from these drawings without creative effort by one of ordinary skill in the art.

DETAILED DESCRIPTION

In order to make the objectives, technical solutions and advantages of the embodiments of the present disclosure clearer, technical solutions of the embodiments of the present disclosure will be clearly and completely described below in combination with the accompanying drawings of the embodiments of the present disclosure. It is apparent that the described embodiments are only part, rather than all, of the embodiments of the present disclosure. Based on the embodiments in the present disclosure, all other embodiments acquired by those skilled in the art without involving any inventive effort shall fall within the scope of protection of the present disclosure. In addition, while the disclosures herein are described by way of one or more exemplary examples, it is to be understood that a complete implementation may also be formed separately with respect to each aspect of these disclosures.

It is to be noted that the brief description of terms in the present disclosure is merely intended to facilitate understanding of the embodiments described below, and is not intended to limit the embodiments of the present disclosure. Unless otherwise specified, these terms is to be understood according to their ordinary and common meaning.

The terms "first", "second", etc. in the specification and claims of the present disclosure and in the above drawings are used for distinguishing similar objects and not necessarily for describing a specific sequence or sequential order. It is to be understood that such used data may be interchangeable under an appropriate circumstance, so that the embodiments of the present disclosure described herein are, for example, capable of being implemented in a sequence other than those illustrated or described herein.

Furthermore, the terms "include" and "having", as well as any variations thereof, are intended to cover a non-exclusive inclusion, for example, a product, or an apparatus that includes a series of steps or elements is not necessarily limited to those expressly listed steps or elements, but may contain other elements not expressly listed or inherent to such product or apparatus.

The terms "module" used herein refers to any combination of known or later developed hardware, software, firmware, artificial intelligence, fuzzy logic, or hardware or/and software code capable of performing functions associated with that element.

In the field of integrated circuits (IC), there is a requirement to discard faulty devices and retain good devices during all device manufacturing processes. The requirement is actually implemented by a test process for detecting the functional integrity of a Device Under Test (DUT) to ensure qualities of integrated circuits manufactured. In order to achieve this process, various test devices are required, which are commonly referred to as Automatic Test Equipment (ATE), or test machines.

Each chip to be tested is independent from one another, and a data receiver of the chip to be tested may result in a data receiving window inconsistent with another chip due to performance difference between data receivers of the two chips. Therefore, if multiple chips to be tested use the same timing information to receive data, a part of the chips to be tested may be unable to accurately receive the data input by the test machine, and a data writing error may occur, thereby resulting in errors in test results.

Figure 1:
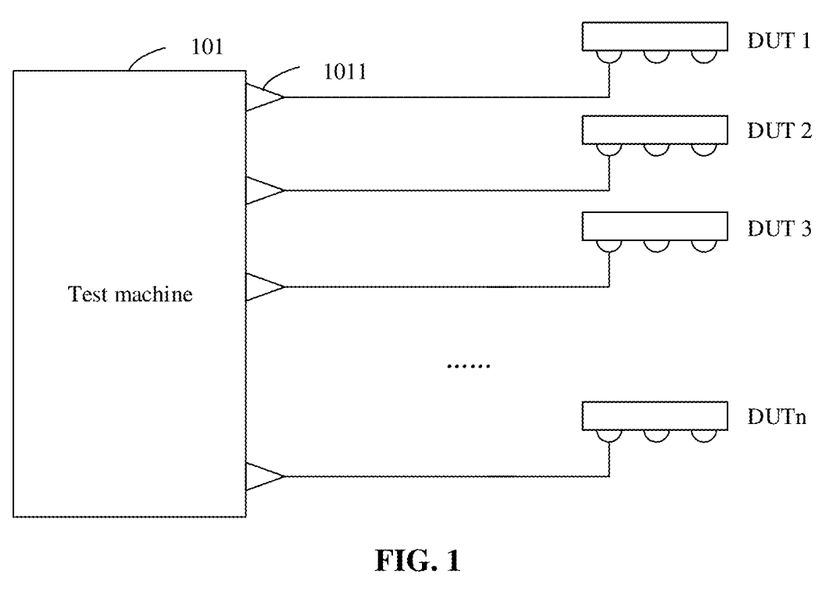
FIG. 1 is a schematic architectural diagram of a chip testing system according to an embodiment of the present disclosure.

Referring to FIG. 1, which is a schematic architectural diagram of a chip testing system according to an embodiment of the present disclosure, in the embodiment of the present disclosure, the chip testing system includes a test machine 101 and multiple chips to be tested, which are respectively DUT1, DUT2, DUT3, . . . , and DUTn.

Optionally, the test machine 101 includes multiple test pins 1011, each of which is connected to a chip to be tested (or DUT). During the test, the test machine 101 needs to input the test data into each chip to be tested.

As shown in FIG. 1, the test machine 101 is connected with n chips to be tested, namely, DUT1, DUT2, DUT3, . . . , and DUTn.

Optionally, the tests include a continuity check, a boundary scan chain test, an automatic test pattern generation (ATPG) test, an Burn-in test, a stress test, and the like, which are not limited in embodiments of the present disclosure.

Optionally, the chip to be tested may be a memory chip, a microprocessor, a standard chip, a System on Chip (SoC), or the like, which is not limited in embodiments of the present disclosure.

Exemplarily, the chip to be tested may be a chip having a data storage function, such as a Dynamic Random Access Memory (DRAM), an Asynchronous Dynamic Random Access Memory (ADRAM), a Read-Only Memory (ROM), an NAND flash memory chip, and a flash chip.

In some embodiments, the chip to be tested may be a central processing unit (CPU), a graphics processing unit (GPU), a field programmable gate array (FPGA), a Microcontroller Unit (MCU), and the like, which is not listed one by one in the embodiments of the present disclosure.

In a conventional test process, a common set of timing information is commonly shared by chips in a test process, that is to say, input times of data for all chips to be tested remain consistent, and input data provided by the test machine 101 arrives at all the chips to be tested simultaneously.

However, each chip to be tested is independent from one another, and a data receiver of the chip to be tested may result in a data receiving window inconsistent with another chip due to performance difference between data receivers of the two chips. Therefore, if multiple chips to be tested use the same timing information to receive data, a part of the chips to be tested may be unable to accurately receive the data input by the test machine, and a data writing error may occur, thereby resulting in errors in test results.

Figure 2:
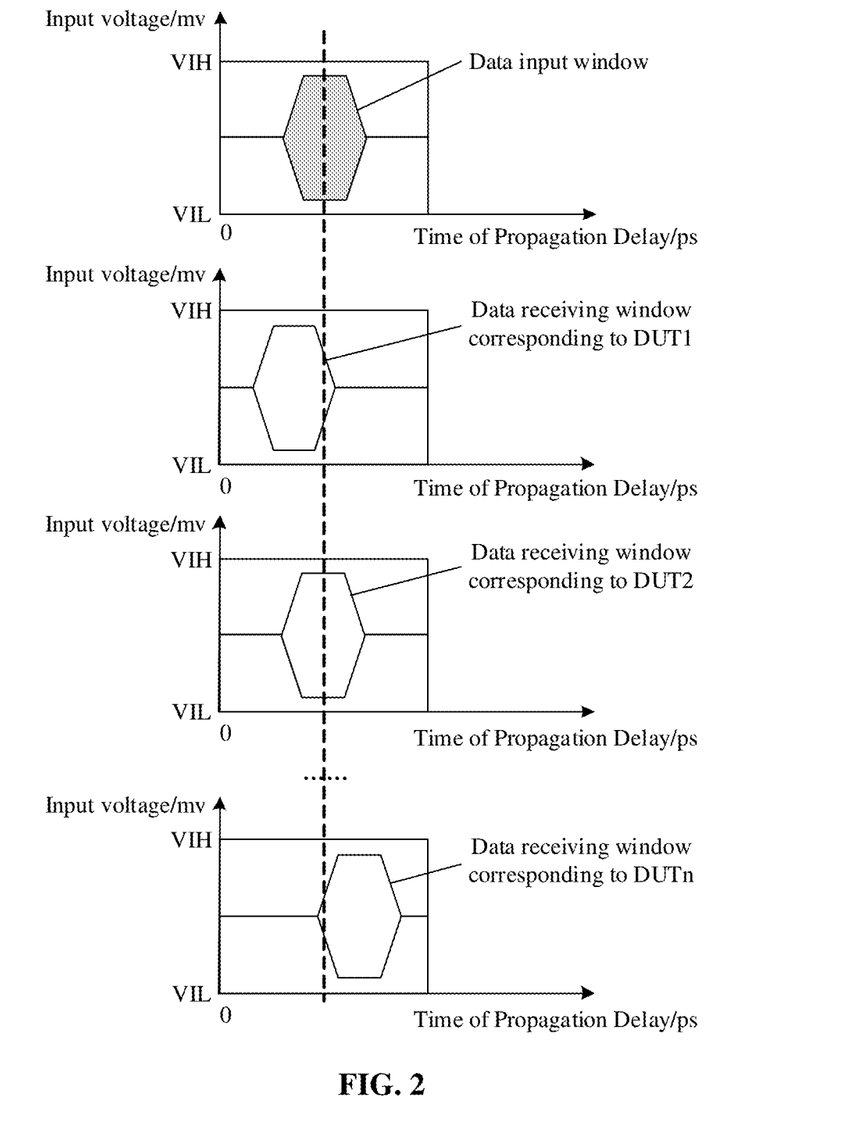
FIG. 2 is a schematic diagram of data receiving windows of multiple chips to be tested in the prior art.

In order to better understand the embodiments of the present disclosure, description is made referring to FIG. 2, which is a schematic diagram of data receiving windows of multiple chips to be tested in the prior art.

In FIG. 2, the signal remains at VIH (Input High Voltage) or VIL (Input Low Voltage) for a period of time, which represents that the transmission of data is not completed until the data is sampled by the chip and corresponding signal is identified.

As can be seen from FIG. 2, positions on the time axis of the data receiving windows corresponding to the chips to be tested DUT1 to DUTn are inconsistent with positions on the time axis of respective data input windows preset for the test machine. As a result, the chips to be tested DUT1, DUT3 and DUTn may not accurately receive data transmitted by the test machine when the test machine inputs the data to each chip to be tested through the data input windows.

In particular, when data is written into the chip to be tested in a high speed, the valid data receiving window of the chip to be tested becomes smaller, which makes it more difficult for the chip to accurately receive the data input by the test machine.

Facing the above technical problems, an embodiment of the present disclosure provides a chip testing method. By testing of each chip to be tested, a data receiving window of each chip to be tested is determined, and then an actual time point when the test machine inputs data to each chip to be tested is adjusted according to the data receiving window of each chip to be tested, so as to ensure that each chip to be tested can receive data in its data receiving window. It is thus possible to avoid data receiving failure due to performance differences between the chips to be tested, and help improve consistency and accuracy of the test results.

Detailed description will be given below using detailed embodiments.

Figure 3:
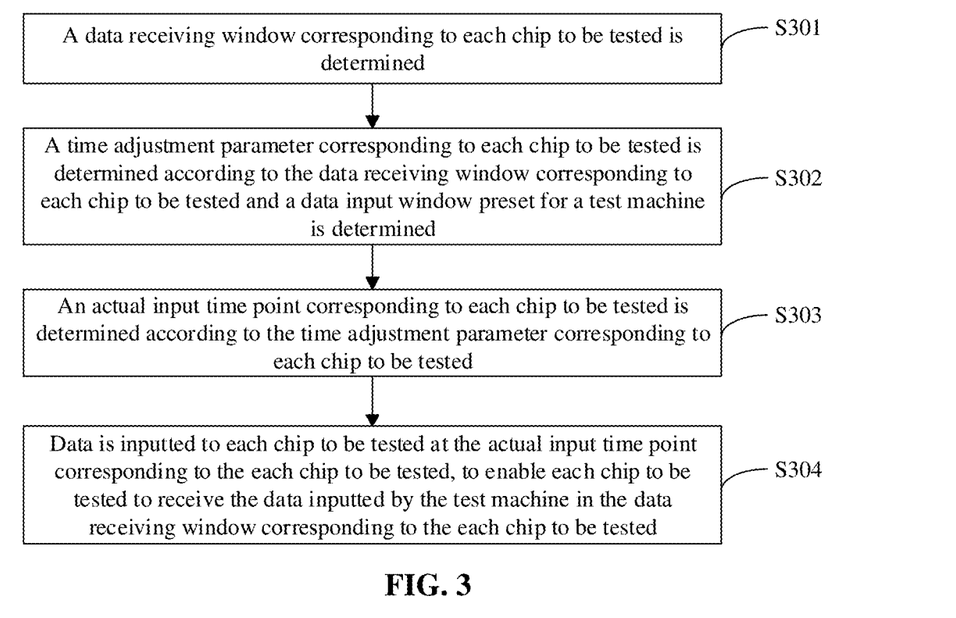
FIG. 3 is a flowchart of a chip testing method according to an embodiment of the present disclosure.

Referring to FIG. 3, which is a flowchart of a chip testing method according to an embodiment of the present disclosure, the execution body in the embodiment may be the test machine in the embodiment shown in FIG. 1, which is not particularly limited herein. In a possible implementation, the chip testing method includes operations S301 to S304.

In operation S301, a data receiving window corresponding to each chip to be tested is determined.

In the embodiment of the present disclosure, when each chip to be tested is tested, test conditions such as data write rate, Tck, Time of Propagation Delay (TPD) and the like may be selected firstly. Then, under the selected test conditions, some preset testing techniques are used to test each chip to be tested to determine the position on the time axis of the data receiving window corresponding to each chip to be tested.

The TPD is the duration required for the digital signal to propagate from an input to an output of a logic gate, and the smaller the TPD is, the faster the chip to be tested works. In the embodiments of the present disclosure, the TPD may be understood as a delay time after which the chip to be tested can successfully receive data at a given clock cycle.

In a possible implementation, the data receiver corresponding to each chip to be tested can be tested to determine the position on the time axis of the data receiving window corresponding to the chip to be tested.

In operation S302, a time adjustment parameter corresponding to each chip to be tested is determined according to the data receiving window corresponding to each chip to be tested and a data input window preset for a test machine is determined.

In a possible implementation, after the data receiving window corresponding to each chip to be tested is determined, the position on the time axis of the data input window of the test machine is determined, and then the time adjustment parameter corresponding to each chip to be tested is determined based on the position on the time axis of the data receiving window corresponding to each chip to be tested and the position on the time axis of the data input window of the test machine, respectively.

It can be understood that, if the data input from the data input window of the test machine is expected to be received in the data receiving window corresponding to the chip to be tested, the data receiving window corresponding to the chip to be tested is required to have an intersection on the time axis with the data input window of the test machine, so that the data input from the data input window of the test machine can be received within the intersection of the data receiving window corresponding to the chip to be tested can receive. Therefore, in a possible implementation, the time adjustment parameter corresponding to each chip to be tested is determined based on the position on the time axis of the data receiving window corresponding to each chip to be tested and the position on the time axis of the data input window of the test machine, respectively, so that the adjusted data receiving window corresponding to each chip to be tested has an intersection on the time axis with the data input window of the test machine.

In operation S303, an actual input time point corresponding to each chip to be tested is determined according to the time adjustment parameter corresponding to each chip to be tested.

In the embodiment of the present disclosure, after the time adjustment parameter corresponding to each chip to be tested is determined, the time point when the test machine inputs data to each chip to be tested is adjusted according to the time adjustment parameter, so that each chip to be tested can receive the data transmitted by the test machine within its data receiving window.

In a possible implementation, the center position on the time axis of the adjusted data input window within which test machine inputs data to each chip to be tested may be used as the actual input time point corresponding to each chip to be tested.

Exemplarily, if the time adjustment parameter corresponding to the chip to be test DUT1 has a value of −50 picosecond (ps), the data input window for inputting data from the test machine to the chip to be tested DUT1 is advanced by 50 ps; if the time adjustment parameter corresponding to the chip to be tested DUT1 has a value of 50 ps, the data input window for inputting data from the test machine to the chip to be tested DUT1 is delayed by 50 ps.

In operation S304, data is inputted to each chip to be tested at the actual input time point corresponding to the each chip to be tested, to enable each chip to be tested to receive the data inputted by the test machine in the data receiving window corresponding to the each chip to be tested.

In the embodiment of the present disclosure, after the position of the data input window in which the test machine inputs data to each chip to be tested is adjusted according to the time adjustment parameter corresponding to the chip to be tested, the test machine can input the data to each chip to be tested within the data input window corresponding to the chip to be tested.

According to the chip testing method and apparatus provided in the embodiments of the present disclosure, during the chip testing process, a time adjustment parameter corresponding to each chip to be tested is determined according to the data receiving window corresponding to each chip to be tested and a data input window preset for a test machine, and the actual time point when the test machine inputs the data to each chip to be tested can be adjusted according to the time adjustment parameter corresponding to each chip to be tested, so that each chip to be tested receives the data input by the test machine in the corresponding data receiving window. In this way, it is possible to effectively avoid the problem that a part of chips to be tested may be unable to accurately receive the data due to the performance differences, and improve the consistency and accuracy of the test results.

Based on the content described in the above embodiments, in a possible implementation of the present disclosure, when the data receiving window corresponding to each chip to be tested is determined, some preset test manners for testing the performance of the chip may be adopted to test each chip to be tested, and the data receiving window corresponding to the chip to be tested is determined according to the test result.

In a possible implementation, the preset test manner may be an SHMOO test. The SHMOO test is performed on each chip to be tested, and the data receiving window corresponding to the chip to be tested is determined according to a result of the SHMOO test corresponding to the chip to be tested.

In the SHMOO test, for each condition parameter related to the chip to be tested, scanning is performed within a certain value range to obtain states of the chip to be tested under different operating conditions, so as to comprehensively evaluate the performance of the chip.

Exemplarily, when the SHMOO test is performed, multiple indicators related to the performance of the chip, such as the maximum operating frequency and the power supply voltage, can be selected, scanning can be performed for the selected (two) indicators in two dimensions, and results of the scanning can be displayed in a two-dimensional X-Y coordinate system, so that the relationship between the two selected variables may be intuitively displayed.

In a possible implementation, the test machine may determine the data receiving window corresponding to each chip to be tested based on the result of the SHMOO test, i.e., a SHMOO plot.

Figure 4:
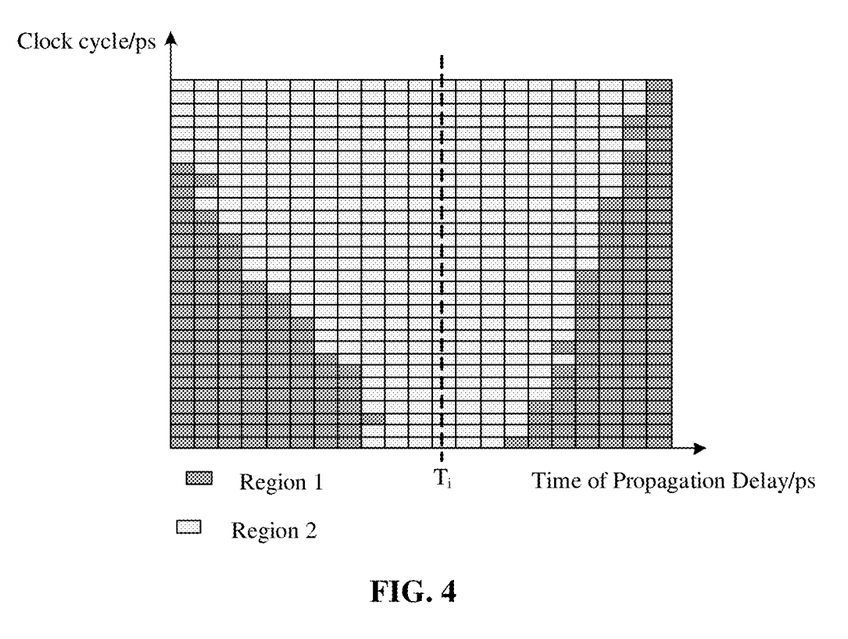
FIG. 4 is a schematic diagram of a chip testing result according to an embodiment of the present disclosure.

To better understand the embodiments of the present disclosure, description is made referring to FIG. 4, which is a schematic diagram of a chip testing result according to an embodiment of the present disclosure.

In FIG. 4, "Region 1" indicates a region where data reception fails, "Region 2" indicates a region where data reception passes, and the junction of "Region 1" and "Region 2" is a fault boundary.

In an actual test process, the TPDs, that the chip to be test can have when successfully receiving data under different clock cycles, can be measured. Then, the data receiving window corresponding to the chip to be tested can be determined according to TPDs corresponding to the chip to be tested when different clock cycles are adopted.

In some embodiments, the position of the data receiving window corresponding to the chip to be tested may be determined according to the distribution of "Region 2".

For example, the center position (Ti) on the time axis of the "Region 2" is determined as the center position of the data receiving window of the chip to be tested.

In some embodiments, other test manners may be used to test each chip to determine a data receiving window corresponding to the chip to be tested.

According to the chip testing method provided in the embodiment of the present disclosure, during the chip testing process, the data receiving window corresponding to each chip to be tested is determined by using the SHMOO test, then the time adjustment parameter corresponding to each chip to be tested can be determined according to the data receiving window corresponding to the chip to be tested and the data input window preset for the test machine, and then the actual time point when the test machine inputs the data to each chip to be tested can be adjusted according to the time adjustment parameter corresponding to the chip to be tested, so that each chip to be tested can receive the data input by the test machine within the corresponding data receiving window, thereby improving the consistency and accuracy of the test results.

Based on the content described in the above embodiments, in some embodiments of the present disclosure, after the data receiving window corresponding to each chip to be tested is determined, time intervals on a time axis occupied by the data input window and the data receiving window corresponding to each chip to be tested are respectively determined; and the time adjustment parameter corresponding to each chip to be tested is determined according to the time intervals on the time axis occupied by the data input window and the data receiving window corresponding to each chip to be tested.

In a possible implementation, when a first time interval on the time axis occupied by the data input window has an intersection with a second time interval on the time axis occupied by the data receiving window corresponding to an i-th chip to be tested, and a duration of the intersection is greater than or equal to a preset duration threshold, it is determined by default that the data input from the data input window can be received within the data receiving window corresponding to the i-th chip to be tested. In this case, the data receiving window of the i-th chip to be tested does not need to be adjusted. Therefore, it can be determined that the time adjustment parameter corresponding to the i-th chip to be tested has a value of 0.

When the first time interval has the intersection with the second time interval and the duration of the intersection is less than the preset duration threshold, or when the first time interval has no intersection with the second time interval, it is determined that the data input from the data input window cannot be received within the data receiving window corresponding to the i-th chip to be tested, and in this case, the time adjustment parameter corresponding to the i-th chip to be tested can be determined according to the preset duration threshold.

In a possible implementation, when the first time interval has the intersection with the second time interval and the duration t of the intersection is less than the preset duration threshold P, it is determined that the time adjustment parameter corresponding to the i-th chip to be detected has a value of T1, where $P-t<T1<(t1+t2-P-t)$;

when the first time interval has no intersection with the second time interval, it is determined that the time adjustment parameter corresponding to the i-th chip to be detected has a value of T2, where $P+t3<T2<(t1+t2+t3-P)$, where t1 is a duration corresponding to the first time interval, t2 is a duration corresponding to the second time interval, and t3 is a duration of a gap between the first time interval and the second time interval.

It is need to be noted that the two endpoints of the first time interval are respectively a start time and an end time on the time axis of the data input window of the test machine, and t1 is a difference between the two endpoints of the first time interval. The two endpoints of the second time interval are respectively a start time and an end time on the time axis of the data receiving window corresponding to the i-th chip to be tested, and t2 is a difference between the two endpoints of the second time interval. T3 is an interval duration between the end time of the first time interval and the start time of the second time interval, or the interval duration between the end time of the second time interval and the start time of the first time interval.

In another possible implementation of the present disclosure, when the first time interval has and intersection with the second time interval, and a duration of the intersection is less than a preset duration threshold, or when the first time interval has no intersection with the second time interval, center values on the time axis of the data input window and the data receiving window corresponding to the i-th chip to be tested are respectively determined; and a time difference between the center value on the time axis of the data input window and the center value on the time axis of the data receiving window corresponding to the i-th chip to be tested is determined as the time adjustment parameter corresponding to the i-th chip to be tested, so that the position on the time axis of the data input window within which the test machine inputs data to each chip to be tested is consistent with the position on the time axis of the data receiving window corresponding to each chip to be tested.

In still another possible implementation of the present disclosure, after the data receiving window corresponding to each chip to be tested is determined, center values on a time axis of the data input window and the data receiving window corresponding to each chip to be tested are respectively determined; and the time adjustment parameter corresponding to each chip to be tested is determined according to a time difference between the center value on the time axis of the data input window of the test machine and the center value on the time axis of the data receiving window corresponding to each chip to be tested.

In some embodiments, the time adjustment parameter corresponding to each chip to be tested is determined through:

$$T_{delay}(i)=T_i-T_0,$$

where $T_{delay}(i)$ represents the time adjustment parameter corresponding to the i-th chip to be tested; $T_i$ represents the center value on the time axis of the data receiving window corresponding to the i-th chip to be tested; and $T_0$ represents the central value on the time axis of the data input window of the test machine.

Exemplarily, if the center position on the time axis of the data receiving window corresponding to the chip to be tested DUT1 is different from the center position on the time axis of the data input window of the test machine has a value of −50 ps, it may be determined that the time adjustment parameter corresponding to the chip to be tested DUT1 has a value of −50 ps; if the difference between the center position on the time axis of the data receiving window corresponding to the chip to be tested DUT2 and the center position on the time axis of the data input window of the test machine has a value of 150 ps, it can be determined that the time adjustment parameter corresponding to the chip to be tested DUT2 has a value of 150 ps.

Figure 5:
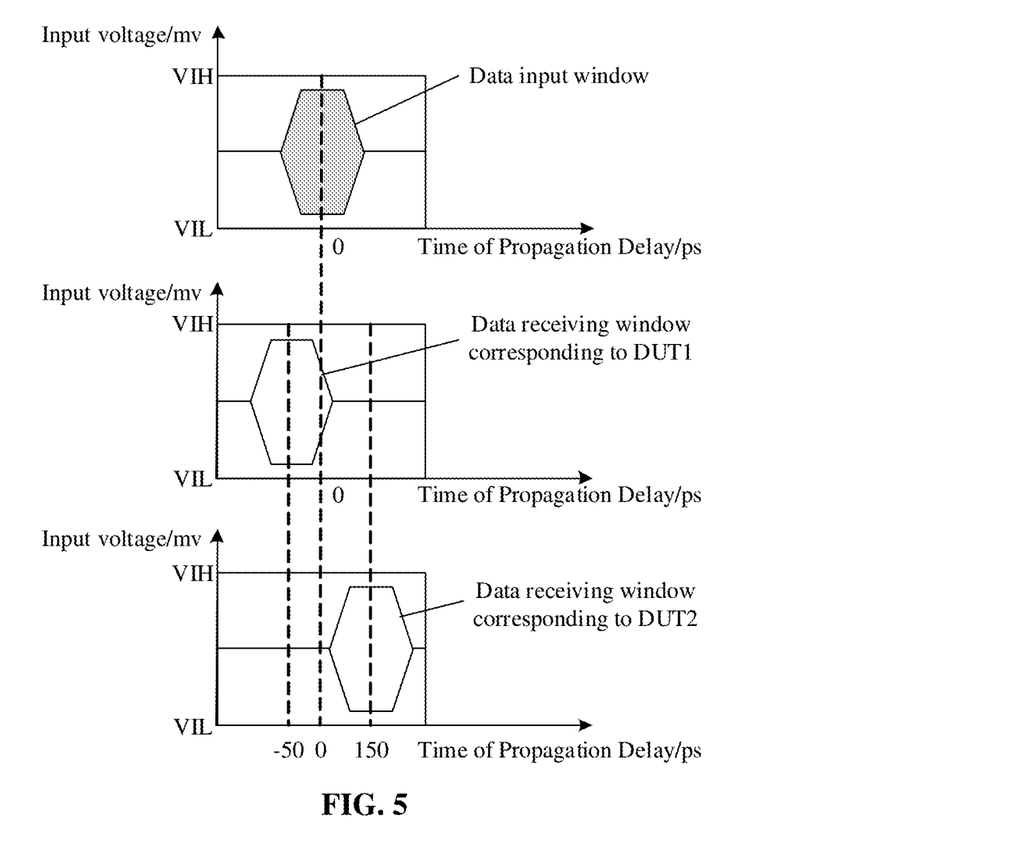
FIG. 5 is a schematic diagram of distribution of data receiving windows of multiple chips to be tested according to an embodiment of the present disclosure.

In order to better understand the embodiment of the present disclosure, description is made referring to FIG. 5, which is a schematic diagram of distribution of data receiving windows of multiple chips to be tested according to an embodiment of the present disclosure.

In FIG. 5, it is assumed that the center value on the time axis of the data input window preset for the test machine is 0 ps, the center value on the time axis of the chip to be tested DUT1 is −50 ps, and the center value on the time axis of the chip to be tested DUT2 is 150 ps, then, it can be determined that the time adjustment parameter $T_{delay}(1)$ of the chip to be tested DUT1 has a value of −50 ps, and the time adjustment parameter $T_{delay}(2)$ of the chip to be tested DUT2 has a value of 150 ps.

In some embodiments, after the time adjustment parameter corresponding to each chip to be tested is determined, the actual input time point corresponding to the chip to be tested can be determined according to the time adjustment parameter, and then a data transmission time point for a test pin of the test machine that is connected to each chip to be tested is adjusted, so that an adjusted data transmission time point coincides with the actual input time point corresponding to the chip to be tested.

Exemplarily, it is assumed that the time adjustment parameter $T_{delay}(1)$ of the chip to be tested DUT1 is determined to have a value of −50 ps, it is necessary to advance the data transmission time point for a test pin of the test machine that is connected to the chip to be tested DUT1 by 50 ps, and the data is input to the chip to be tested DUT1 by 50 ps in advance on the basis of the original timing information. It is assumed that the time adjustment parameter $T_{delay}(2)$ of the chip to be tested DUT2 is determined to have a value of 150 ps, it is necessary to delay the data transmission time point for a test pin of the test machine that is connected to the chip to be tested DUT2 by 150 ps, and the data is input to the chip to be tested DUT2 after a delay of 150 ps on the basis of the original timing information.

Figure 6:
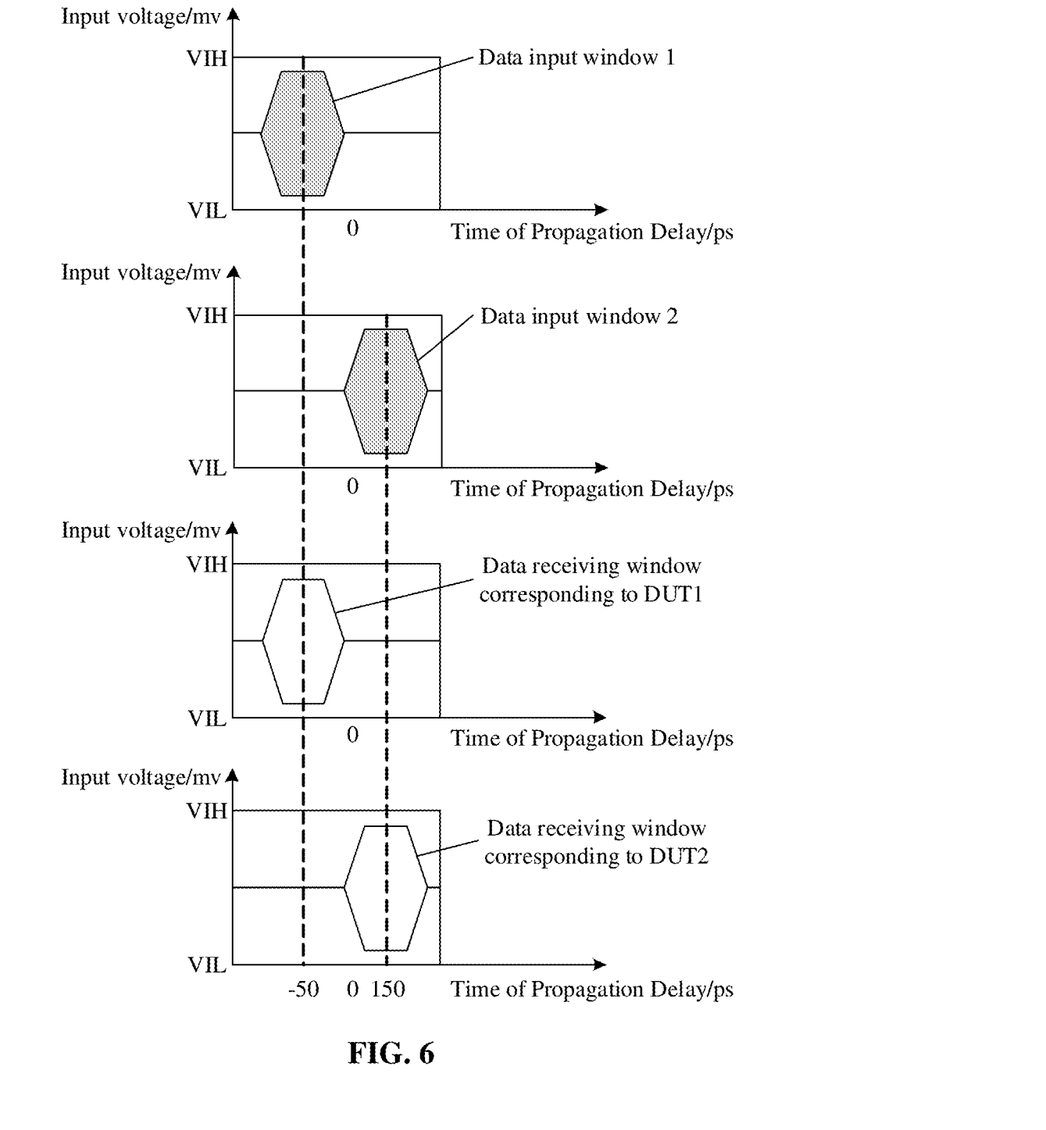
FIG. 6 is a schematic diagram of distribution of adjusted data input windows according to an embodiment of the present disclosure.

In order to better understand the embodiment of the present disclosure, description is made referring to FIG. 6, which is a schematic diagram of distribution of adjusted data input windows according to an embodiment of the present disclosure.

As shown in FIG. 6, the test machine inputs data to the chip to be tested DUT1 in the data input window 1 and inputs data to the chip to be tested DUT2 in the data input window 2.

According to the chip testing method provided in the embodiments of the present disclosure, the time adjustment parameter corresponding to each chip to be tested is determined according to the time difference between the center value on the time axis of the data input window and the center value on a time axis of the data receiving window corresponding to each chip to be tested, and then the data transmission time point for a test pin of the test machine that is connected to each chip to be tested is adjusted according to the time adjustment parameter corresponding to each chip to be tested, so that each chip to be tested can receive the data input from the test machine within the corresponding data receiving window. In this way, it is possible to help improve the consistency and accuracy of the test results.

Figure 7:
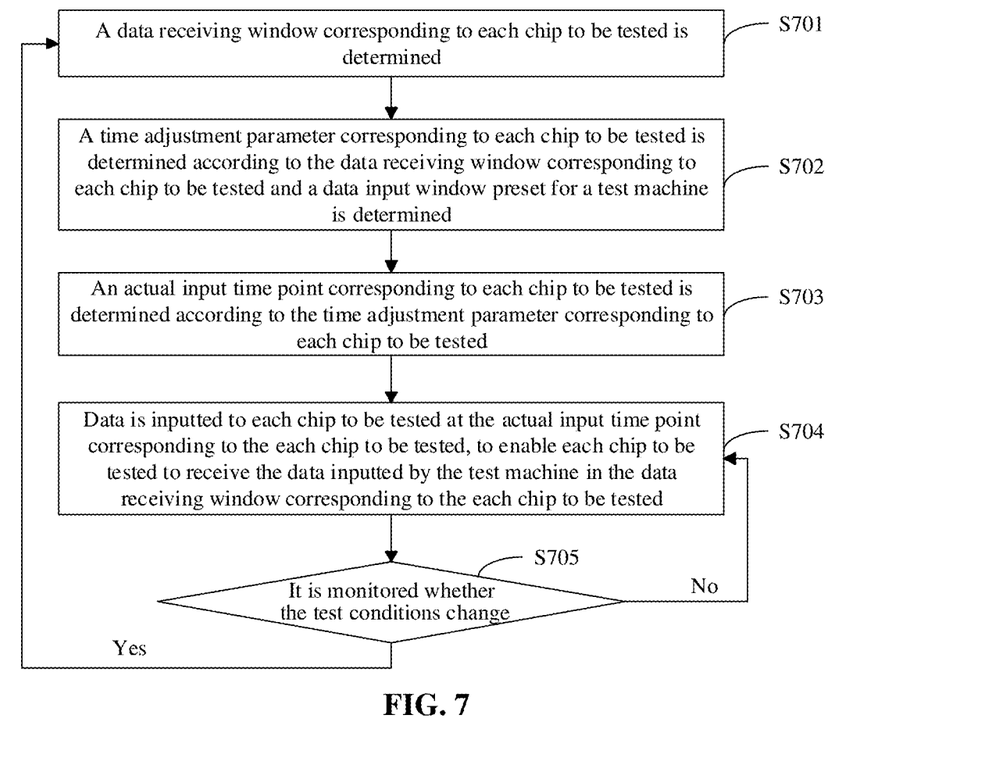
FIG. 7 is a flowchart of another chip testing method according to an embodiment of the present disclosure.

Referring to FIG. 7, which is a flowchart of another chip testing method according to an embodiment of the present disclosure, and based on the content described in the foregoing embodiments, the execution body in the embodiment may be the test machine in the embodiment shown in FIG. 1, which is not particularly limited herein. In a possible implementation, the chip testing method includes operations S701-S704:

At S701, a data receiving window corresponding to each chip to be tested is determined.

At S702, a time adjustment parameter corresponding to each chip to be tested is determined according to the data receiving window corresponding to each chip to be tested and a data input window preset for a test machine is determined;

At S703, an actual input time point corresponding to each chip to be tested is determined according to the time adjustment parameter corresponding to each chip to be tested.

At S704, data is inputted to each chip to be tested at the actual input time point corresponding to the each chip to be tested, to enable each chip to be tested to receive the data inputted by the test machine in the data receiving window corresponding to the each chip to be tested.

Further contents regarding operations S701 to S704 are same as those described in operations S301 to S304 in the foregoing embodiments. For details, reference can be made to the contents described in the foregoing embodiments, which are not described again in this embodiment of the present disclosure.

At S705, it is monitored whether the test conditions change. If yes, the process returns to operation S701; if not, the process returns to operation S704.

In a possible implementation of the present disclosure, after the actual input time point corresponding to each chip to be tested is determined, it is monitored whether the test conditions of the chip to be tested or the test machine change monitored. If the change occurs, it is necessary to return to operation S701 to re-determine the data receiving window and the time adjustment parameter corresponding to each chip to be tested.

In a possible implementation, if it is detected that the data input window preset for the test machine changes, or that the data receiving manner of each chip to be tested changes, it can be considered that the test conditions change.

Exemplarily, when the data write rate, Tck, TPD and the like in the test process change, it can be considered that the test conditions change.

According to the chip testing method provided in the embodiments of the present disclosure, after the actual input time point corresponding to each chip is adjusted, if the test conditions change, the actual input time point corresponding to each chip needs to be determined again, thereby avoiding a case where a part of the chip to be tested cannot accurately receive data due to the change of the test conditions.

Figure 8:
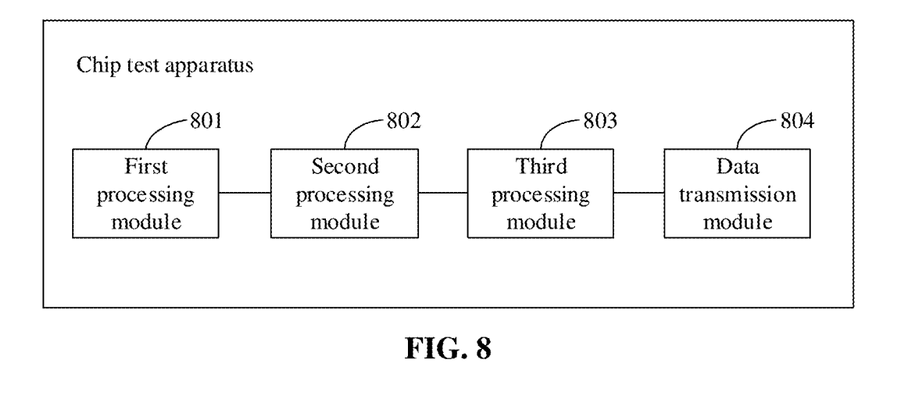
FIG. 8 is a schematic diagram of program modules of a chip testing apparatus according to an embodiment of the present disclosure.

Based on the contents described in the above embodiments, the present embodiment further provides a chip testing apparatus, which can be applied to a test machine. Referring to FIG. 8, it is a schematic diagram of program modules of a chip testing apparatus according to an embodiment of the present disclosure. The chip testing apparatus includes a first processing module 801, a second processing module 802, a third processing module 803 and a data transmission module 804:

The first processing module 801 is configured to determine a data receiving window corresponding to each chip to be tested.

The second processing module 802 is configured to determine a time adjustment parameter corresponding to each chip to be tested according to the data receiving window corresponding to each chip to be tested and a data input window preset for a test machine.

The third processing module 803 is configured to determine an actual input time point corresponding to each chip to be tested according to the time adjustment parameter corresponding to each chip to be tested The data transmission module 804 is configured to input data to each chip to be tested at the actual input time point corresponding to the each chip to be tested, to enable each chip to be tested to receive the data inputted by the test machine in the data receiving window corresponding to the each chip to be tested.

In the chip testing apparatus provided in the embodiment of the present disclosure, during the chip testing process, a time adjustment parameter corresponding to each chip to be tested is determined according to the data receiving window corresponding to each chip to be tested and a data input window preset for a test machine, and the actual time point when the test machine inputs the data to each chip to be tested can be adjusted according to the time adjustment parameter corresponding to each chip to be tested, so that each chip to be tested receives the data input by the test machine in the corresponding data receiving window. In this way, it is possible to effectively avoid the problem that a part of chips to be tested may be unable to accurately receive the data due to the performance differences, and improve the consistency and accuracy of the test results.

In a possible implementation, the first processing module 801 is specifically configured to:
test each chip to be tested in a preset test manner, and determine the data receiving window corresponding to each chip to be tested according to a test result.

Optionally, the preset test manner may be an SHMOO test. The SHMOO test is performed on each chip to be tested, and the data receiving window corresponding to the chip to be tested is determined according to a result of the SHMOO test corresponding to the chip to be tested.

In a possible implementation, the second processing module 802 is specifically configured to:
respectively determine time intervals on a time axis occupied by the data input window and the data receiving window corresponding to each chip to be tested; and
determine the time adjustment parameter corresponding to each chip to be tested according to the time intervals on the time axis occupied by the data input window and the data receiving window corresponding to each chip to be tested.

In a possible implementation, the second processing module 802 is specifically configured to:
when a first time interval on the time axis occupied by the data input window has an intersection with a second time interval on the time axis occupied by the data receiving window corresponding to an i-th chip to be tested, and a duration of the intersection is greater than or equal to a preset duration threshold, determine that the time adjustment parameter corresponding to the i-th chip to be tested has a value of 0; and
when the first time interval has the intersection with the second time interval and the duration of the intersection is less than the preset duration threshold, or when the first time interval has no intersection with the second time interval, determine the time adjustment parameter corresponding to the i-th chip to be tested according to the preset duration threshold.

In a possible implementation, the second processing module 802 is specifically configured to:
when the first time interval has the intersection with the second time interval and the duration t of the intersection is less than the preset duration threshold P, determine that the time adjustment parameter corresponding to the i-th chip to be detected has a value of T1, where $P-t<T1<(t1+t2-P-t)$;

when the first time interval has no intersection with the second time interval, determine that the time adjustment parameter corresponding to the i-th chip to be detected has a value of T2, where $P+t3<T2<(t1+t2+t3-P)$, where t1 is a duration corresponding to the first time interval, t2 is a duration corresponding to the second time interval, and t3 is a duration of a gap between the first time interval and the second time interval.

In a possible implementation, the second processing module 802 is specifically configured to:
when a first time interval on the time axis occupied by the data input window has an intersection with a second time interval on the time axis occupied by the data receiving window corresponding to an i-th chip to be tested and a duration of the intersection is less than a preset duration threshold, or when the first time interval has no intersection with the second time interval, respectively determine center values on the time axis of the data input window and the data receiving window corresponding to the i-th chip to be tested; and
determine, a time difference between the center value on the time axis of the data input window and the center value on the time axis of the data receiving window corresponding to the i-th chip to be tested, as the time adjustment parameter corresponding to the i-th chip to be tested.

In a possible implementation, the second processing module 802 is specifically configured to:
determine center values on a time axis of the data input window and the data receiving window corresponding to each chip to be tested, respectively; and determine the time adjustment parameter corresponding to each chip to be tested according to a time difference between the center value on the time axis of the data input window and the center value on the time axis of the data receiving window corresponding to each chip to be tested.

In one possible embodiment, the second processing module 802 is configured to:

determine the time adjustment parameter $T_{delay}(i)$ corresponding to the i-th chip to be tested through:

$$T_{delay}(i)=T_i-T_0,$$

where $T_i$ represents the center value on the time axis of the data receiving window corresponding to the i-th chip to be tested; and $T_0$ represents the central value on the time axis of the data input window.

In a possible implementation, the third processing module 803 is further configured to:

adjust a data transmission time point for a test pin of the test machine that is connected to the i-th chip to be tested, so that an adjusted data transmission time point coincides with the actual input time point corresponding to the i-th chip to be tested.

In a possible implementation, the apparatus further includes an updating module.

The updating module is configured to return to and perform an operation performed by the first processing module, in response to detecting that the data input window preset for the test machine changes or a data receiving mode of each chip to be tested changes.

It is to be noted that reference can be made to operations in the chip testing method described in the embodiments shown in FIGS. 3 to 7 for detailed operations performed by the first processing module 801, the second processing module 802, the third processing module 803, and the data transmission module 804 described in the above embodiments, which will not be repeated herein.

Furthermore, based on the content described in the above embodiments, an electronic device is further provided in the present embodiment, which includes at least one processor and a memory. The memory stores computer execution instructions, the at least one processor executes the computer-executable instructions stored in the memory, to cause the at least one processor to perform each operation in the chip testing method described in the embodiments. Reference is made to the description in the above embodiments for details, which will not be repeated herein.

Optionally, the electronic device may be a test machine.

Figure 9:
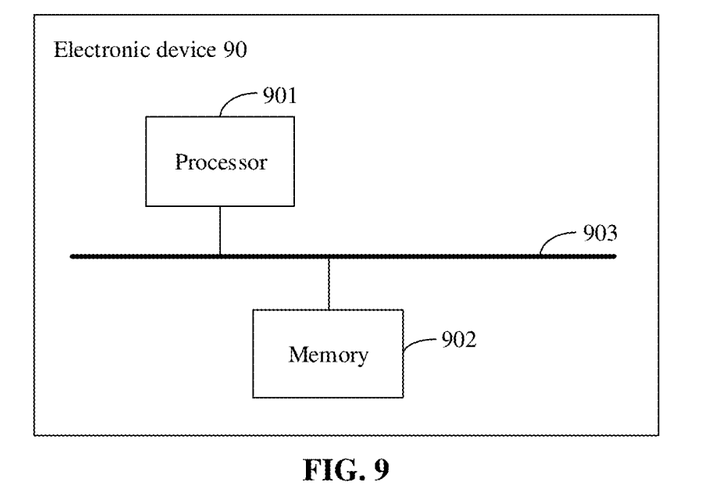
FIG. 9 is a schematic diagram of a hardware structure of an electronic device according to an embodiment of the present disclosure.

To better understand the embodiments of the present disclosure, description is made referring to FIG. 9, which is a schematic diagram of a hardware structure of an electronic device according to the embodiment of the present disclosure.

Optionally, the electronic device may be a test machine.

As shown in FIG. 9, the electronic device of the present embodiment includes a processor 901 and a memory 902.

The memory 902 stores computer-execution instructions;

The processor 901 is configured to execute the computer-execution instructions stored in the memory, and may implement each operation in the chip testing method described in the foregoing embodiments. Reference is made to the description in the above embodiments for details, which will not be repeated herein.

Optionally, the memory 902 may be either independent or integrated with the processor 901.

When the memory 902 is independently provided, the apparatus further includes a bus 903 for connecting the memory 902 and the processor 901.

Furthermore, based on the content described in the foregoing embodiments, the present embodiment further provides a computer-readable storage medium. The computer-readable storage medium has stored thereon computer-executable instructions that, when executed by a processor, cause the processor to implement each step in the chip testing method described in the foregoing embodiments.

Furthermore, based on the content described in the foregoing embodiments, the embodiment of the present disclosure further provides a computer program product including computer programs. When the computer programs are executed by a processor, each operation in the chip testing method described in the foregoing embodiment may be implemented. Reference is made to the description in the above embodiments for details, which will not be repeated herein.

In several embodiments provided in the disclosure, it is to be understood that, the disclosed apparatus and method may be implemented in another manner. The device embodiments described above is only schematic, and for example, division of the module is only logic function division, and other division manners may be adopted during practical implementation. For example, multiple module or components may be combined or integrated into another system, or some characteristics may be neglected or not performed. In addition, the module shown or discussed are coupled to each other, or directly coupled. Alternatively, the shown or discussed coupling or direct coupling or communication connection to one another may be via some interface, indirect coupling or communication connection to a device or module, may be in electrical, mechanical or other form.

The above-mentioned units described as separate parts may be or may not be physically separate, and the parts shown as units may be or may not be physical elements, which may be located in one place or distributed to multiple network elements. Part or all of the units may be selected to achieve the objectives of the solutions of the embodiments according to practical requirements.

In addition, each functional module in each embodiment of the present disclosure may be integrated in one processing unit, or each module may be physically present alone, or two or more modules may be integrated in one unit. The above unit integrated by the module may be implemented in the form of hardware or hardware plus software functional unit.

The integrated module implemented in the form of a software functional module may be stored in a computer readable storage medium. The software function modules stored in the storage medium include instructions for causing a computer device (which may be a personal computer, a server, a network device, or the like) or a processor to perform part of the operations of the method described in each embodiment of the present disclosure.

It is to be understood that the processor may be a central processing unit (CPU), or may be another general purpose processor, a digital signal processor (DSP), an application specific integrated circuit (ASIC), or the like. The general purpose processor may be a microprocessor or the processor that may be any conventional processor or the like. The operations of the method disclosed in the present disclosure may be directly performed by a hardware processor, or may be performed by a combination of hardware and software modules in the processor.

The memory may include a high-speed RAM memory, or may also include a nonvolatile storage (NVM), such as at least one magnetic disk memory, or may be a U disk, a removable hard disk, a read-only memory, a magnetic disk, or an optical disk.

The bus may be an Industry Standard Architecture (ISA) bus, a Peripheral Component Interconnect (PCI) bus, an Extended Industry Standard Architecture (EISA) bus, and the like. The bus may be divided into an address bus, a data bus, a control bus, and the like. For convenience of representation, the bus in the drawings of the present disclosure is not limited to only one bus or one type of bus.

The storage medium may be implemented by any type of volatile or nonvolatile storage device or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc. The storage medium may be any available medium that can be accessed by a general purpose or special computer.

An exemplary storage medium is coupled to a processor to enable the processor to read information from the storage medium and write information into it. Of course, the storage medium may also be an integral part of the processor. The processor and the storage medium may be located in an Application Specific Integrated Circuits (ASIC). Of course, the processor and the storage medium may also exist as discrete components in the electronic device or the master device.

A person of ordinary skill in the art may understand that all or some of operations for implementing the foregoing method embodiments are achieved by a program by instructing related hardware; the foregoing program can be stored in a computer-readable storage medium; when the program is executed, operations included in the foregoing method embodiments are executed. Moreover, the foregoing storage medium includes various media capable of storing a program code such as an ROM, an RAM, a magnetic disk, or an optical disk.

Finally, it is to be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without making the essence of the corresponding technical solutions depart from the scope of the technical solutions of the embodiments of the present disclosure.

What is claimed is:

1. A chip testing method, comprising:
   determining a data receiving window corresponding to each chip to be tested;
   determining a time adjustment parameter corresponding to each chip to be tested according to the data receiving window corresponding to each chip to be tested and a data input window preset for a test machine;
   determining an actual input time point corresponding to each chip to be tested according to the time adjustment parameter corresponding to each chip to be tested; and
   inputting data to each chip to be tested at the actual input time point corresponding to the each chip to be tested, to enable each chip to be tested to receive the data inputted by the test machine in the data receiving window corresponding to the each chip to be tested;
   wherein
   determining the time adjustment parameter corresponding to each chip to be tested according to the data receiving window corresponding to each chip to be tested and the data input window preset for the test machine comprises:
   respectively determining time intervals on a time axis occupied by the data input window preset and the data receiving window corresponding to each chip to be tested; and
   determining the time adjustment parameter corresponding to each chip to be tested according to the time intervals on the time axis occupied by the data input window preset and the data receiving window corresponding to each chip to be tested.

2. The method of claim 1, wherein
   determining the data receiving window corresponding to each chip to be tested comprises:
   testing each chip to be tested in a preset test manner, and determining the data receiving window corresponding to each chip to be tested according to a test result.

3. The method of claim 1, wherein
   determining the time adjustment parameter corresponding to each chip to be tested according to the time intervals on the time axis occupied by the data input window preset and the data receiving window corresponding to each chip to be tested comprises:
   when a first time interval on the time axis occupied by the data input window preset has an intersection with a second time interval on the time axis occupied by the data receiving window corresponding to an i-th chip to be tested, and a duration of the intersection is greater than or equal to a preset duration threshold, determining that the time adjustment parameter corresponding to the i-th chip to be tested has a value of 0; and
   when the first time interval has the intersection with the second time interval and the duration of the intersection is less than the preset duration threshold, or when the first time interval has no intersection with the second time interval, determining the time adjustment parameter corresponding to the i-th chip to be tested according to the preset duration threshold.

4. The method of claim 3, wherein
   determining the time adjustment parameter corresponding to the i-th chip to be tested according to the preset duration threshold value comprises:
   when the first time interval has the intersection with the second time interval and the duration t of the intersection is less than the preset duration threshold P, determining that the time adjustment parameter corresponding to the i-th chip to be detected has a value of T1, where $P-t<T1<(t1+t2-P-t)$;

when the first time interval has no intersection with the second time interval, determining that the time adjustment parameter corresponding to the i-th chip to be detected has a value of T2, where $P+t3<T2<(t1+t2+t3-P)$, where t1 is a duration corresponding to the first time interval, t2 is a duration corresponding to the second time interval, and t3 is a duration of a gap between the first time interval and the second time interval.

5. The method of claim 1, wherein
   determining the time adjustment parameter corresponding to each chip to be tested according to the time intervals on the time axis occupied by the data input window preset and the data receiving window corresponding to each chip to be tested comprises:

when a first time interval on the time axis occupied by the data input window preset has an intersection with a second time interval on the time axis occupied by the data receiving window corresponding to an i-th chip to be tested and a duration of the intersection is less than a preset duration threshold, or when the first time interval has no intersection with the second time interval, respectively determining center values on the time axis of the data input window preset and the data receiving window corresponding to the i-th chip to be tested; and determining, a time difference between the center value on the time axis of the data input window preset and the center value on the time axis of the data receiving window corresponding to the i-th chip to be tested, as the time adjustment parameter corresponding to the i-th chip to be tested.

6. The method of claim 1, wherein determining the time adjustment parameter corresponding to each chip to be tested according to the data receiving window corresponding to each chip to be tested and the data input window preset by the test machine comprises:

respectively determining center values on a time axis of the data input window preset and the data receiving window corresponding to each chip to be tested; and determining the time adjustment parameter corresponding to each chip to be tested according to a time difference between the center value on the time axis of the data input window preset and the center value on the time axis of the data receiving window corresponding to each chip to be tested.

7. The method of claim 6, wherein determining the time adjustment parameter corresponding to each chip to be tested according to the time difference between the center value on the time axis of the data input window preset and the center value on the time axis of the data receiving window corresponding to each chip to be tested comprises:

determining the time adjustment parameter $T_{delay}(i)$ corresponding to the i-th chip to be tested through:

$T_{delay}(i)=T_i-T_0$, where $T_i$ represents the center value on the time axis of the data receiving window corresponding to the i-th chip to be tested; and T0 represents the central value on the time axis of the data input window preset.

8. The method of claim 1, further comprising:

after determining the actual input time point corresponding to each chip to be tested, adjusting a data transmission time point for a test pin of the test machine that is connected to the i-th chip to be tested, until an adjusted data transmission time point coincides with the actual input time point corresponding to the i-th chip to be tested.

9. The method of claim 1, further comprising:

after determining the actual input time point corresponding to each chip to be tested, in response to detecting that the data input window preset for the test machine changes or a data receiving mode of each chip to be tested changes, returning to and performing an operation of determining the data receiving window corresponding to each chip to be tested.

10. A chip testing apparatus, comprising:

a memory storing processor-executable instructions; and a processor configured to execute the stored processor-executable instructions to perform operations of:

determining a data receiving window corresponding to each chip to be tested;

determining a time adjustment parameter corresponding to each chip to be tested according to the data receiving window corresponding to each chip to be tested and a data input window preset for a test machine;

determining an actual input time point corresponding to each chip to be tested according to the time adjustment parameter corresponding to each chip to be tested; and inputting data to each chip to be tested at the actual input time point corresponding to the each chip to be tested, to enable each chip to be tested to receive the data inputted by the test machine in the data receiving window corresponding to the each chip to be tested;

wherein determining the time adjustment parameter corresponding to each chip to be tested according to the data receiving window corresponding to each chip to be tested and the data input window preset for the test machine comprises:

respectively determining time intervals on a time axis occupied by the data input window preset and the data receiving window corresponding to each chip to be tested; and determining the time adjustment parameter corresponding to each chip to be tested according to the time intervals on the time axis occupied by the data input window preset and the data receiving window corresponding to each chip to be tested.

11. The apparatus of claim 10, wherein determining the data receiving window corresponding to each chip to be tested comprises:

testing each chip to be tested in a preset test manner, and determine the data receiving window corresponding to each chip to be tested according to a test result.

12. The apparatus of claim 10, wherein determining the time adjustment parameter corresponding to each chip to be tested according to the time intervals on the time axis occupied by the data input window preset and the data receiving window corresponding to each chip to be tested comprises:

when a first time interval on the time axis occupied by the data input window preset has an intersection with a second time interval on the time axis occupied by the data receiving window corresponding to an i-th chip to be tested, and a duration of the intersection is greater than or equal to a preset duration threshold, determining that the time adjustment parameter corresponding to the i-th chip to be tested has a value of 0; and when the first time interval has the intersection with the second time interval and the duration of the intersection is less than the preset duration threshold, or when the first time interval has no intersection with the second time interval, determining the time adjustment parameter corresponding to the i-th chip to be tested according to the preset duration threshold.

13. The apparatus of claim 12, wherein determining the time adjustment parameter corresponding to the i-th chip to be tested according to the preset duration threshold value comprises:

when the first time interval has the intersection with the second time interval and the duration t of the intersection is less than the preset duration threshold P, determining that the time adjustment parameter corresponding to the i-th chip to be detected has a value of T1, where $$P-t<T1<(t1+t2-P-t);$$

when the first time interval has no intersection with the second time interval, determine that the time adjustment parameter corresponding to the i-th chip to be detected has a value of T2, where $$P+t3<T2<(t1+t2+t3-P);$$

where t1 is a duration corresponding to the first time interval, t2 is a duration corresponding to the second time interval, and t3 is a duration of a gap between the first time interval and the second time interval.

14. The apparatus of claim 10, wherein
determining the time adjustment parameter corresponding to each chip to be tested according to the time intervals on the time axis occupied by the data input window preset and the data receiving window corresponding to each chip to be tested comprises:
when a first time interval on the time axis occupied by the data input window preset has an intersection with a second time interval on the time axis occupied by the data receiving window corresponding to an i-th chip to be tested and a duration of the intersection is less than a preset duration threshold, or when the first time interval has no intersection with the second time interval, respectively determining center values on the time axis of the data input window preset and the data receiving window corresponding to the i-th chip to be tested; and
determining, a time difference between the center value on the time axis of the data input window preset and the center value on the time axis of the data receiving window corresponding to the i-th chip to be tested, as the time adjustment parameter corresponding to the i-th chip to be tested.

15. The apparatus of claim 10, wherein
determining the time adjustment parameter corresponding to each chip to be tested according to the data receiving window corresponding to each chip to be tested and the data input window preset by the test machine comprises:
respectively determining center values on a time axis of the data input window preset and the data receiving window corresponding to each chip to be tested; and
determining the time adjustment parameter corresponding to each chip to be tested according to a time difference between the center value on the time axis of the data input window preset and the center value on the time axis of the data receiving window corresponding to each chip to be tested.

16. The apparatus of claim 15, wherein
determining the time adjustment parameter corresponding to each chip to be tested according to the time difference between the center value on the time axis of the data input window preset and the center value on the time axis of the data receiving window corresponding to each chip to be tested comprises:
determining the time adjustment parameter $T_{delay}(i)$ corresponding to the i-th chip to be tested through:

$$T_{delay}(i)=Ti-T0,$$

where Ti represents the center value on the time axis of the data receiving window corresponding to the i-th chip to be tested; and T0 represents the central value on the time axis of the data input window preset.

17. The apparatus of claim 10, wherein
the processor is configured to execute the stored processor-executable instructions to further perform an operation of:
adjusting a data transmission time point for a test pin of the test machine that is connected to the i-th chip to be tested, until an adjusted data transmission time point coincides with the actual input time point corresponding to the i-th chip to be tested.

18. A non-transitory computer-readable storage medium having
stored thereon computer-executable instructions that, when executed by a processor, cause the processor to implement operations of:
determining a data receiving window corresponding to each chip to be tested;
determining a time adjustment parameter corresponding to each chip to be tested according to the data receiving window corresponding to each chip to be tested and a data input window preset for a test machine;
determining an actual input time point corresponding to each chip to be tested according to the time adjustment parameter corresponding to each chip to be tested; and
inputting data to each chip to be tested at the actual input time point corresponding to the each chip to be tested, to enable each chip to be tested to receive the data inputted by the test machine in the data receiving window corresponding to the each chip to be tested;
wherein
determining the time adjustment parameter corresponding to each chip to be tested according to the data receiving window corresponding to each chip to be tested and the data input window preset for the test machine comprises:
respectively determining time intervals on a time axis occupied by the data input window preset and the data receiving window corresponding to each chip to be tested; and
determining the time adjustment parameter corresponding to each chip to be tested according to the time intervals on the time axis occupied by the data input window preset and the data receiving window corresponding to each chip to be tested.

* * * * *